United States Patent
Simon

(10) Patent No.: US 10,030,973 B2
(45) Date of Patent: Jul. 24, 2018

(54) METHOD AND DEVICE FOR THE CYCLIC DIGITAL TRANSFER OF A POSITION VALUE OF A MOVING OBJECT HAVING INERTIAL MASS

(75) Inventor: Olaf Simon, Bruchsal (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 553 days.

(21) Appl. No.: 13/992,389

(22) PCT Filed: Nov. 3, 2011

(86) PCT No.: PCT/EP2011/005545
§ 371 (c)(1),
(2), (4) Date: Jun. 7, 2013

(87) PCT Pub. No.: WO2012/076087
PCT Pub. Date: Jun. 14, 2012

(65) Prior Publication Data
US 2013/0261802 A1    Oct. 3, 2013

(30) Foreign Application Priority Data

Dec. 10, 2010 (DE) .................. 10 2010 054 141
May 31, 2011 (DE) .................. 10 2011 103 735

(51) Int. Cl.
*G01B 21/16* (2006.01)
*G05B 15/02* (2006.01)
(Continued)

(52) U.S. Cl.
CPC ............ *G01B 21/16* (2013.01); *G01D 21/00* (2013.01); *G05B 15/02* (2013.01); *H03M 1/26* (2013.01);
(Continued)

(58) Field of Classification Search
CPC ........ G01B 21/16; G01D 21/00; G05B 15/02; G05B 19/414; G05B 2219/31137;
(Continued)

(56) References Cited

U.S. PATENT DOCUMENTS 6,388,656 B1    5/2002  Chae
7,925,462 B2    4/2011  Tiemann
(Continued)

FOREIGN PATENT DOCUMENTS

CN    1256425 A    6/2000
CN    101828095 A   9/2010
(Continued)

OTHER PUBLICATIONS

International Search Report, dated Apr. 5, 2012, issued in corresponding International Application No. PCT/EP2011/005545.
(Continued)

*Primary Examiner* — John H Le
(74) *Attorney, Agent, or Firm* — Hunton Andrews Kurth LLP

(57) ABSTRACT

A method and device for the cyclic digital transfer of a position value of a moving object having inertial mass, the value range of the transferred position value being limited in such a way that no whole revolution or, in the case of a linear motion, other complete period that is conditional upon mechanical conditions is mappable, and the actual position is generated by detecting, in an evaluation unit, instances of the value range being exceeded.

16 Claims, 2 Drawing Sheets

(51) Int. Cl.
*G01D 21/00* (2006.01)
*H03M 1/26* (2006.01)
*H04Q 9/00* (2006.01)

(52) U.S. Cl.
CPC .......... *H04Q 9/00* (2013.01); *H04Q 2209/826* (2013.01); *H04Q 2209/84* (2013.01)

(58) Field of Classification Search
CPC . G05B 2219/50229; G05B 9/02; H03M 1/26; H04Q 2209/826; H04Q 2209/84; H04Q 9/00; H04L 12/403; G01L 321/16
USPC ..... 702/150, 151, 94; 318/563, 568.22, 600, 318/611; 370/465

See application file for complete search history.

(56) References Cited

U.S. PATENT DOCUMENTS

| | | | |
|---|---|---|---|
| 7,949,009 B2 | 5/2011 | Schultze | |
| 8,866,431 B2* | 10/2014 | Kawajiri | G05B 9/02 318/568.22 |
| 2001/0006344 A1 | 7/2001 | Gaessler et al. | |
| 2009/0161691 A1* | 6/2009 | Schultze | G05B 19/414 370/465 |
| 2010/0211273 A1 | 8/2010 | Kollner et al. | |

FOREIGN PATENT DOCUMENTS

| | | |
|---|---|---|
| DE | 10 2007 062 333 | 4/2009 |
| EP | 2023092 A2 | 2/2009 |

OTHER PUBLICATIONS

European Office Action issued in European Patent Application 15 002 901.5 dated Jul. 12, 2016.

* cited by examiner

METHOD AND DEVICE FOR THE CYCLIC DIGITAL TRANSFER OF A POSITION VALUE OF A MOVING OBJECT HAVING INERTIAL MASS

FIELD OF THE INVENTION

The present invention relates to a method and a device for the cyclic digital transfer of a position value of a moving object having inertial mass.

BACKGROUND INFORMATION

Angular sensors are generally known. In the case of angular sensors, which are generally incremental encoders, the measured angular value of a shaft is transferred digitally.

SUMMARY

Example embodiments of the present invention refine the transfer of the measured values from the angular sensor to an electronic device, the intention being to use an interference-resistant data transfer.

In the case of the device and a method, features of example embodiments of the present invention are that It is advantageous that the digital transfer be resistant to interference effects, such as magnetic field radiation, etc.

The method for the cyclic digital transfer of a position value of a moving object having an inertial mass includes the features that the value range of the transferred position value be limited such that no whole revolution or, in the case of a linear motion, other full period that is conditional upon mechanical conditions be mappable, and that the actual position be generated by detecting, in an evaluation unit, instances of the value range being exceeded;

in particular, a position that is not value range-limited or that is far less value range-limited than in continuous operation being transferred at a first point in time;

and/or the value range being determined in that the path difference occurring in one sampling cycle at maximum velocity is smaller than half of the selected value range, the value range being selected to be as small as possible;

and/or the value range being determined in that the path difference occurring in one sampling cycle at maximum velocity is smaller than half of the selected value range, the value range being selected to be as small as possible.

It is advantageous that only a small data stream needs to be transmitted and, thus, a small bandwidth suffices for the transmission. Moreover, an enhanced reliability may be achieved since, following transfer of the complete position value, a comparison to the position value determined from the value range-limited value may be made, making it thus possible to monitor whether the maximally allowed acceleration had been exceeded, thus, whether an unforeseeable event, such as errors, etc., has occurred. Alternatively, the need for cyclically transferring the complete position value is also omitted, so that a data connection having a small bandwidth suffices for a rapid position value transfer. Thus, the data captured by a sensor may be transmitted in compressible and data-compressed form.

The complete information on the position value may be readily reconstructed by comparing the difference to half of the value range.

In an alternative method for the cyclic digital transfer of a position value of a moving object having inertial mass, the value range of the transferred position value may be limited relative to the value range of possible position values, in particular, so that no whole revolution or, in the case of a linear motion, any other full period conditional upon mechanical conditions be mappable, and the actual position may be determined in that an estimated value for the position is generated from the previous position and the previously determined velocity and is corrected using the transferred, value range-limited position value, in particular, an exceedance of the value range being ascertained by comparing the value range-limited, estimated position value to the transferred, value range-limited position value and being used to correct the estimated value;

and/or a position being transferred once at the beginning whose value range encompasses the range of possibly occurring positions;

and/or, instead of the value range-limited absolute position, the difference from the previous position being transferred under the same value-range limitation.

It is advantageous that the position value be captured on an inertial mass. By thereby enabling the limitation of the occurring accelerations and jerky motion, thus, the time derivatives of the accelerations, it is thereby made possible to limit the change in velocity in the corresponding cycle time, so that an estimated value only needs to be corrected by less than one resolution unit, for example, of a coarsely resolved track.

The method for the digital transfer of a position value of a moving object having an inertial mass has the features that the position value is characterized by at least two values, in particular, partial angular value and subangular value and/or fine angular value, in particular, digital values, it being possible for the first value to be characterized by a whole number, and a position value range being assigned to each number;

each position range characterized by a first value being assigned mutually separate partial ranges of the position range; each of these partial ranges being characterized by a second value that may be characterized as a whole number;

a position value being measured at a first point in time, and the corresponding first and second value being transferred;

(i) one further position value being measured, and the corresponding, thus newly measured second value being transferred, (ii) whereupon the position value range characterized by the first value, thus also the first value corresponding to the newly measured position value, being determined from the newly measured, second value and the previously measured, second value.

It is advantageous that the complete information on the measured position value is available, in turn, at a first point in time, and thus a new position value defined only relative to this first position value is consequently determined. Thus, a compressed data transmission or an increased redundancy in the data transmission is made possible.

In example embodiments, the position value is an angular value of a rotating part, thus object; as an inertial mass, the object having a moment of inertia. It is advantageous in this context that the complete 360° revolution be divisible into a plurality of partial ranges, making it possible to resolve the complete revolution into the thereby formed position value ranges.

In example embodiments, the transfer is periodically repeated over time, thus, in particular, cyclically repeated, in particular, at regular time intervals, in particular, steps (i) and (ii) being carried out multiple times in succession. It is advantageous that the position may be determined on a constantly recurring basis. In this context, the time intervals are preferably short enough to ensure, in turn, that the maximum position value change to be expected remains below a critical value that is preferably below one half of a position value range.

Example embodiments provide for an estimated value to be determined in step (ii) from the previously measured or determined position value and from the corresponding velocity, and for the second value of the newly measured position value to be compared to the second value of the estimated value, and for the difference between the second value and the newly measured position value and the second value of the estimated value to be determined, and for the position range corresponding to the newly measured position value to be determined therefrom. It is advantageous in this context that a velocity value be known and, for that reason, for an estimated value be at all determinable, in that the position value change resulting from the velocity and the corresponding time interval be added to the old position value.

In example embodiments, the difference between the newly measured second value and the previously measured second value is determined in step (ii); in particular, in response to exceedance of half of a position range, it being inferred that the newly measured position value resides in an adjacent position range. It is advantageous in this context that the new position value is readily fully determinable from the difference and from the knowledge of the maximum position value change to be expected, although merely one limited value range needs to be transferred.

In example embodiments, the newly measured second value and the previously measured second value are compared in step (ii), and that adjacent range is determined in which the newly measured position value resides, in particular, when the difference between the newly measured second value and the previously measured second value exceeds half of one position range. It is advantageous that it is thereby made readily possible to fully determine the position value in spite of the transferred and limited information.

In example embodiments, the change in velocity between two position measurements taken in succession at a time interval Δt is limited to a critical value, in particular, that is determined or at least co-determined by the inertial mass. It is advantageous in this context that only one finite number, in particular two, of possible position values is/are attainable, and it is solely from this finite number that the new position value must be determined.

In example embodiments, the position value is an angular value or a linear position, in particular, the velocity being an angular velocity or a velocity occurring in the linear direction. It is advantageous that the invention may be used for rotary and linear drive controls, thus, independently of the type of position-sensing sensor.

In example embodiments, a first and second value are assigned to a specific track, in particular, encoder track, the first value being assigned to a more finely resolving track than the second value. It is advantageous that only one limited information value needs to be transferred, and the complete information on the position is nevertheless attainable.

In example embodiments, mutually separate partial ranges of the position range are assigned to each position range that is characterized by a second value, in particular, subangular value; each of these partial ranges being characterized by a third value, in particular, fine angular value, that may be characterized as a whole number;

in particular, the position value being measured at the first point in time, and the corresponding first, second and third value being transferred;

the third value being transferred with the second value, in particular, before or after the second value. It is advantageous that, as a first value, a partial angle, and, as a second value, a subangle may be measured and transferred, the subangle being more finely resolvable by a fine angular range. The transmission of the fine angle and subangle information sufficing then in this context in order to determine the more coarsely resolving partial angle.

The method for controlling a drive has the features that a position value is measured in a periodically repeated process, and the corresponding information is transmitted to a control device, in particular, using a method as described herein, the position value being characterized by at least two values, in particular, partial angular value and fine angular value, in particular, digital values, it being possible for the first value to be characterized by a whole number, and a position value range being assigned to each number;

each position range characterized by a first value being assigned mutually separate partial ranges of the position range, each of these partial ranges being characterized by a second value that may be characterized as a whole number;

the second value being transferred before the first value;
(i) following transfer of the newly measured second value, a first value being determined from the newly measured and the previously transferred second value that corresponds to the newly measured first value; and a control device using the thus determined position value in order to determine an updated value of a manipulated variable of the control device, in particular, step (i) being repeated.

It is advantageous that the time duration of the transfer of the first value may be already used to determine the next manipulated variable value.

Among features of the method for controlling a drive are that a position value is measured in a periodically repeated process, and the corresponding information is transmitted to a control device, the position value being characterized by at least two values, in particular, a partial angular value and a fine angular value, in particular, digital values, it being possible for the first value to be characterized by a whole number, and a position value range being assigned to each number;

each position range characterized by a first value being assigned mutually separate partial ranges of the position range; each of these partial ranges being characterized by a second value that may be characterized as a whole number;

the second value being transferred before the first value;
(i) following transfer of the newly measured second value, a first value, which corresponds to the newly measured first value, being determined from the newly measured and the previously transferred second value, taking the most recently determined velocity additionally into account, and a control device using the thus determined position value in order to determine an updated value of a manipulated variable of the control device;

(ii) following transfer of the newly measured second value, the velocity value being updated from the newly measured first value and the newly measured second value, the previously measured first value and the previously measured second value also being taken into account, steps (i) and (ii) being repeated. It is advantageous that, even in the case of an occurring velocity, an estimated value may be determined, and this merely needs to be still corrected.

Example embodiments provide that the first value, following transfer thereof, be compared to the value determined in accordance with step (i) and, in the case of a deviation, an action is triggered, in particular, such as displaying and/or communicating warning information and/or switching off the drive and/or triggering a safe condition of the drive. It is advantageous that safety is enhanced.

In example embodiments, a position value is captured in a sensor, and the sensor is linked via a digital interface to an evaluation unit, the evaluation unit having a memory and having means for determining the position value from a transferred, value range-limited position value, in particular, the evaluation unit being linked to a control device.

It is advantageous that only a small bandwidth is needed for the data transmission.

Further features and aspects of example embodiments of the present invention are explained in greater detail below with reference to the appended schematic Figures.

DETAILED DESCRIPTION

Figure 1:
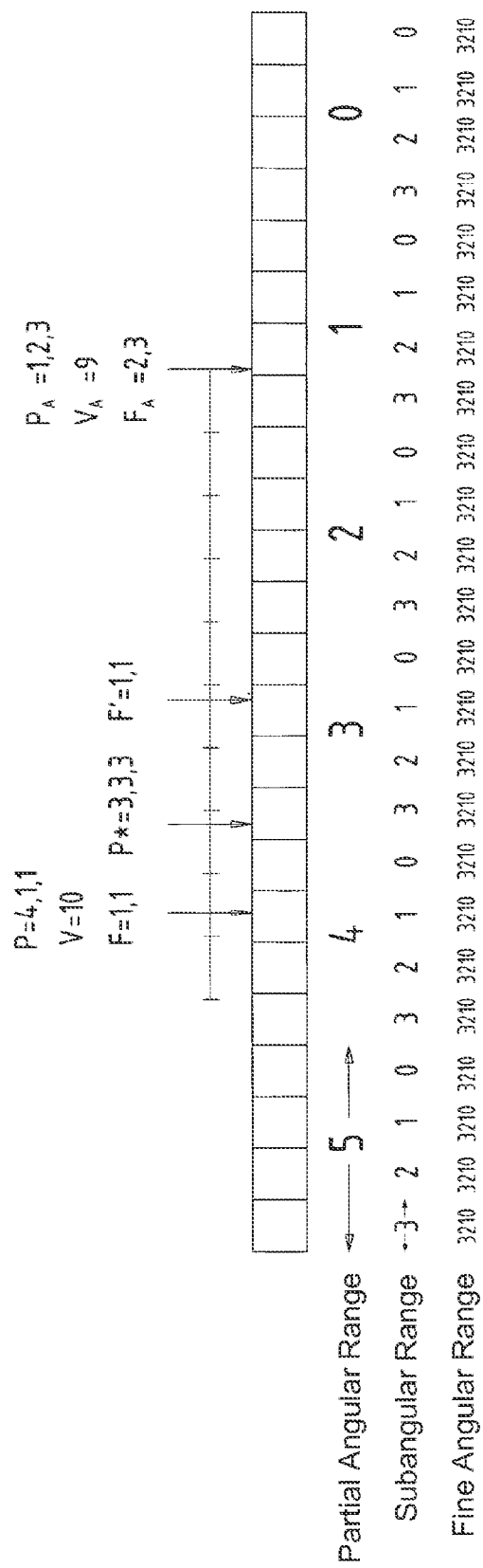
FIG. 1 illustrates an example embodiment of the present invention.

In the case of the drive system, an angular sensor is connected in a torsionally fixed manner to a shaft of the drive, for example, to a motor shaft of an inverter-fed electromotor or to a shaft of a gear driven by an inverter-fed electromotor, making it possible to sense the angular position.

In this case, the angular value is transferred in digital form, thus as a digital telegram or word, in a first time period.

The value transferred to the signal electronics of the inverter is used by a control unit provided in the signal electronics to regulate the motor current to a particular desired setpoint value by adjusting the motor voltage.

The angular value is characterized by a partial angular range and also by at least one fine angular range. The partial angle is merely a course resolution of the complete 360° revolution. The fine angle subdivides the particular partial angular range into finer angular sections.

Upon transfer of the angular value, the fine angular value is transferred first and the coarser partial angular value subsequently thereto.

By taking critical values, in particular maximum acceleration values and/or maximum jerky motion, into account, thus time derivatives of the acceleration, and the most recently known angular value and angular velocity value, the signal electronics is already able to determine the newly measured angular value from the fine angular values.

This allows the control unit to consider the newly measured angular value for the control at a very early stage in the process. In accordance with example embodiments of the present invention, only few computational steps are needed to determine the newly measured angular value, which is why only little computing time is needed. The motor voltage value to be newly adjusted in each case by the inverter is then calculated in the control unit from the thus determined angular value and further values.

During this calculation time, the coarser partial angular values are also transferred from the angular sensor to the signal electronics of the inverter.

The actually measured angular value is then directly known in sufficient time before the next time step. Thus, reliability is then enhanced since the angular value determined from the fine angle and the value transferred in its entirety may be compared with one another. Moreover, for the next angular determination, may be carried out from the next fine angular value, using the completely transferred angular value and a correspondingly updated angular velocity value.

Therefore—in other words—thus, in each time step, the most recently, completely transferred value, thus encompassing the fine angular value and partial angular value, is used and, by subtracting it from the previous value, the updated velocity is determined. From these values, an estimated value is then determined for the next angular value to be expected. To determine this angular value, it is considered that an inertial mass is driven, in particular, linearly or rotationally, by the drive, and, in this context, the velocity in the corresponding time step may only change by a maximum amount. This thus determined estimated value may also be characterized by a fine angular value, a partial angular value, and, in some instances, by a subangular value. The then newly transferred fine angular value of the angular value that is newly measured and transferred from the angular sensor is then used for determining the new angular value that the control unit then immediately uses. Following the complete transfer of the newly measured angular value that took place in parallel hereto, a comparison is then made to the value determined only from the transferred fine angular value, whereby a safety-oriented testing may be implemented. The method is repeated; from the completely transferred angular value, in turn, the updated angular velocity being determined, and then repeatedly used accordingly.

In example embodiments, the completely transferred angular value is only used at a first time step. In the subsequent time steps, only the angular value determined from the particular estimated value and the fine angular value, preferably also from an additional subangular value is used multiple times.

For the sake of further improvement, a subangular range is provided, whose resolution is provided between the resolution of the fine angular range and the partial angular range.

In a first variant, two tracks are provided, namely the partial angular track and the fine angular track. In this context, m partial angular ranges are configured in the circumferential direction, and the partial angular ranges are equally long in the circumferential direction. In the same manner, the fine angular ranges are equally long in the circumferential direction. The same number of fine angular ranges are assigned to each partial angular section, this number being able to be counted off in each instance from 0 to n−1. In this context, m and n are each integers.

Following a first time period, in which the partial angular value, thus the number of the partial angle is measured by the angular sensor, and the fine angular value F1, thus the number of the fine angle is captured by the angular sensor, fine angular value F2 is measured following a time interval Δt.

To determine the angular value, thus the information missing on the new partial angular value, it is determined from the difference from the new to the previous fine angular value F2−F1 and from the comparison of F1 and F2, whether an overrun in the positive or negative direction of rotation has taken place or not. To this end, it is important that the maximum possible angular velocity v_max be merely so small that it holds that (½*m−1)≤v_max*Δt≤(½*m).

Thus, in the case of overrun, it is only possible to enter into an immediately adjacent partial angle, thus partial angular range. Thus, when the angle position detection is carried out in a very small time interval Δt, it allows the newly measured angular value to be uniquely reconstructed from the mere information of the newly measured fine angle measured value and the previous angular value.

This sensing of the fine angular value may be repeated as often as needed following a specific further time interval Δt. Thus, even the transfer of the fine angular value alone suffices to determine the newly measured angular value in each case; it being necessary, however, for the measured angular value to be completely known at a first point in time.

FIG. 1 illustrates a second variant of an example embodiment having three tracks, namely having a partial angular track, a subangular track and a fine angular track that resolves the subangular track more finely. In this context, m partial angular ranges, for example m=32, are configured in the circumferential direction, and the partial angular ranges are equally long in the circumferential direction. In the same manner, the subangular ranges are equally long in the circumferential direction, each partial angle being divided into n subangular ranges. The fine angular ranges are equally long in the circumferential direction, each subangular range being assigned q fine angular ranges. The same number of subangular ranges are assigned to each partial angular section, this number being able to be counted off in each instance from 0 to n−1. In this context, m, q and n are each integers. In FIG. 1, q=4 and n=4.

Since the angle position detection is carried out on a system having inertial mass, and the occurring accelerations are below a maximum value of a_max, a change in the angular velocity within time interval Δt is only possible by maximum velocity difference v_max=a_max*Δt.

From last known angular velocity v_old and last known angle α_old, an estimated value α_estimated=α_old+v_old*Δt is derived.

The change in angle relative to this estimated value is maximally Δv_max*Δt and generates a maximum overrun of the subangle into the immediately adjacent subangular range.

Therefore, to determine the next angular value, there is no need for the measured new value of the partial angle, subangle and fine angle to be available, rather the subangle and the fine angle suffice if the angular value valid for the preceding time period is known. Then, the new subangular range is derived from the comparison of the old subangular value with the new subangular value and from the difference between the new and old subangular values. Since the new fine angle is transferred, this value is also known, the fine angular value uniquely assigning an angular value to the new subangular value.

This method may be represented in FIG. 1 based on a specific example: The old angular value is exemplarily $P_A$=(partial angular value=1, subangular value=2, fine angular value=3). Old angular velocity 9 is subangular ranges per time period Δt. Thus, an estimated value of P*=(partial angular value=3, subangular value=3, fine angular value=3) is derived.

If, at this point, the new measured value features fine angle 1 and subangle 1, two possible angular values are derived, which are denoted by F=(subangle 1, fine angle 1) and F'=(subangle 1, fine angle 1). Since, however, at this point, maximally occurring velocity change Δv_max=a_max*Δt is selected, in turn, in such a way that Δv_max*Δt is smaller than half of the partial angular range, the subtraction operation and the comparison make it clearly ascertainable that new angular value is F, but not F'. Thus, the new angular value is defined as P=(partial angular value=4, subangular value=1, fine angular value=1), resulting in the new velocity being defined as 10 subangular ranges per time period Δt. Thus, this eliminates the need for transferring the newly measured partial angular value.

Figure 2:
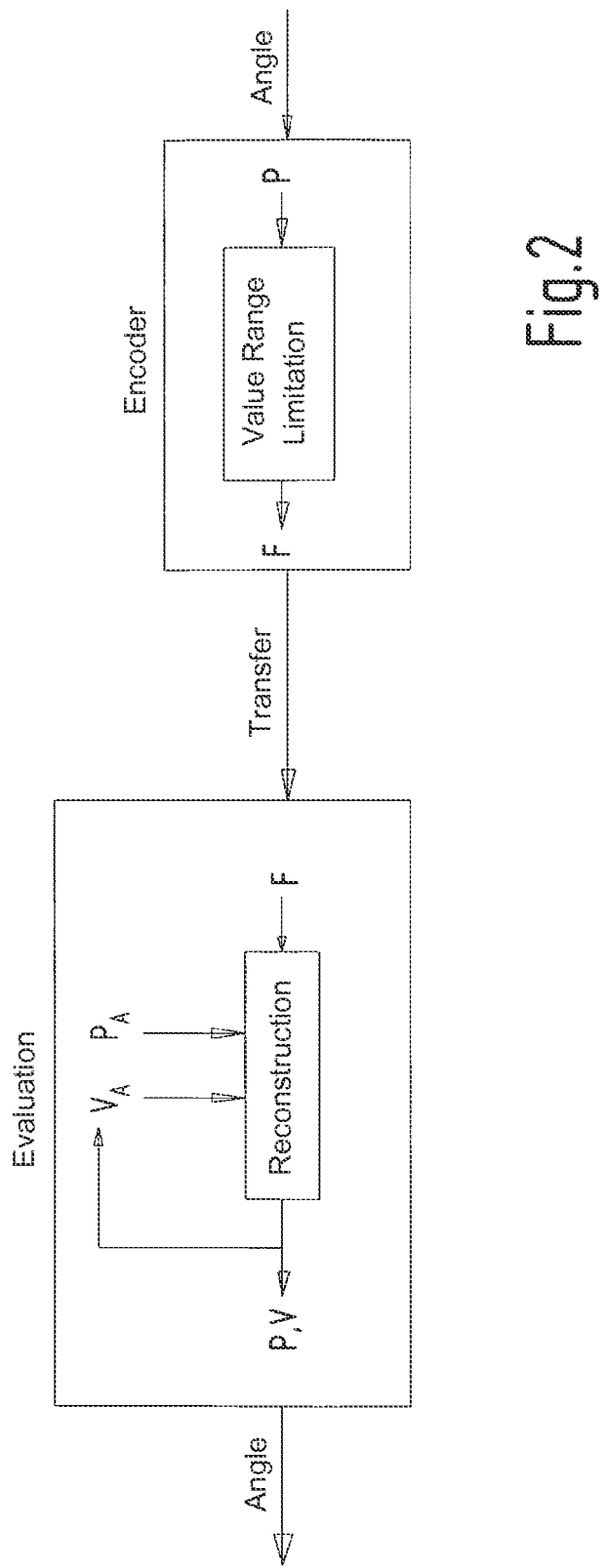
FIG. 2 illustrates a method according to an example embodiment of the present invention.

FIG. 2 shows the method in greater detail. The newly acquired information on angular value P in the angular sensor is reduced to a partial information F, which only includes the subangular value and the fine angular value, not, however, the partial angular value. This value F is transferred to the evaluation circuit which is preferably configured in the control electronics of an inverter or converter.

Newly measured angular value P and newly occurring angular velocity v are determined in the evaluation circuit from partial information F, taking into account the previously measured or determined angular value $P_A$ and previously determined angular velocity $v_A$.

LIST OF REFERENCE CHARACTERS $P_A$ previously measured angular value
P* estimated value for the angle
P newly determined angular value
F intermediate value
F' second intermediate value
$v_A$ previously determined angular velocity

What is claimed is:
1. A method for cyclic digital transfer of a position value of a moving object, comprising:
limiting a value range of a transferred position value such that no whole revolution or, for a linear motion, other complete period that is conditional upon mechanical conditions is mappable, wherein the value range corresponds to a partial section of at least one of the whole revolution and the other complete period that includes the transferred position value;
generating an actual position by detecting, in an evaluation unit, instances of the value range being exceeded;
wherein a position that is not value range-limited or that is far less value range-limited than in continuous operation is transferred at a first point in time; and/or the value range being determined in that the path difference occurring in one sampling cycle at maximum velocity being smaller than half of the selected value range, the value range being selected to be as small as possible; and/or a difference from a previous position being transferred under the same value-range limitation; and
regulating, with a control device, a motor current to a desired setpoint based on the actual position, wherein the regulating of the motor current includes adjusting a motor voltage.

2. The method according to claim 1, wherein the position value is an angular value of a rotating part, as an inertial mass, having a moment of inertia.

3. The method according to claim 1, wherein the transfer is periodically repeated over time, and/or cyclically repeated, and/or at regular time intervals.

4. The method according to claim 1, wherein the change in velocity between two position measurements taken in succession in a time interval is limited to a critical value, that is determined or at least co-determined by the inertial mass.

5. The method according to claim 1, wherein the position value is an angular value or a linear position, and the velocity is an angular velocity or a velocity occurring in a linear direction.

6. A method for controlling a drive, comprising:
measuring a position value in a periodically repeated process;
transferring information corresponding to the measured position value to a control device by the method recited in claim 1;
characterizing the position value by at least two values, including a partial angular value and a fine angular value, and/or digital values, a first value being characterized by a whole number, and a position value range being assigned to each number, wherein the position value range corresponds to a partial section of a complete period that includes the position value;
assigning each position range characterized by a first value, mutually separate partial ranges of the position range; each partial range being characterized by a second value that can be characterized as a whole number;
transferring the second value before the first value;
wherein following transfer of a newly measured second value, a first value, which corresponds to a newly measured first value, is determined from the newly measured and the previously transferred second value; and the control device uses the thus determined position value in order to determine an updated value of a manipulated variable of the control device, and
regulating, with the control device, a motor current to a desired setpoint based on the determined position value, wherein the regulating of the motor current includes adjusting a motor voltage.

7. A device for implementing the method as recited in claim 1, comprising:
a sensor adapted to capture a position value, the sensor being linked via a digital interface to an evaluation unit, the evaluation unit having a memory and a determination device adapted to determine the position value from a transferred, value range-limited position value;
wherein the evaluation unit being linked to the control device.

8. A method for cyclic digital transfer of a position value of a moving object, comprising:
limiting a value range of a transferred position value relative to a value range of possible position values, so that no whole revolution or, for a linear motion, other full period that is conditional upon mechanical conditions is mappable, wherein the value range corresponds to a partial section of at least one of the whole revolution and the other full period that includes the transferred position value;
determining an actual position in that an estimated value for the position is generated from a previous position and a previously determined velocity, and
correcting the actual position using a transferred, value range limited position value, wherein an exceedance of the value range is ascertained by comparing the value range-limited, estimated position value to the transferred, value range-limited position value and being used to correct the estimated value; and/or a position being transferred once at a beginning whose value range encompasses the range of possibly occurring positions; and/or a difference from the previous position is transferred under the same value-range limitation; and
regulating, with a control device, a motor current to a desired setpoint based on the actual position, wherein the regulating of the motor current includes adjusting a motor voltage.

9. A method for digital transfer of a position value of a moving object, comprising
characterizing the position value by at least two values, including a partial angular value and subangular value and/or fine angular value, and/or digital values, a first value being characterized by a whole number; and a position value range being assigned to each number, each position range characterized by a first value being assigned mutually separate partial ranges of the position range; each of these partial ranges being characterized by a second value that can be characterized as a whole number, wherein the position value range corresponds to a partial section of a complete period that includes the position value;
measuring a position value at a first point in time;
transferring corresponding first and second values;
wherein a further position value is measured, and corresponding, newly measured, second value is transferred; and a position value range characterized by the first value, also from the first value corresponding to the newly measured position value is determined from the newly measured, second value and a previously measured second value; and
regulating, with a control device, a motor current to a desired setpoint based on the further position value, wherein the regulating of the motor current includes adjusting a motor voltage.

10. The method according to claim 9, wherein an estimated value is determined from the previously measured or determined position value and from the corresponding velocity, and the second value of the newly measured position value is compared to the second value of the estimated value, and the difference between the second value and the newly measured position value and the second value of the estimated value is determined, and the position range corresponding to the newly measured position value is determined therefrom.

11. The method according to claim 9, wherein the difference between the newly measured second value and the previously measured second value is determined, in response to exceedance of half of a position range, it is inferred that the newly measured position value resides in an adjacent position range.

12. The method according to claim 9, wherein the newly measured second value and the previously measured second value are compared; and that adjacent range is determined in which the newly measured position value resides, when the difference between the newly measured second value and the previously measured second value exceeds half of one position range.

13. The method according to claim 9, wherein a first and second value are assigned to a specific track and/or an encoder track, the first value being assigned to a more finely resolving track than the second value.

14. The method according to claim 1, wherein mutually separate partial ranges of the position range are assigned to each position range that is characterized by a second value and/or subangular value, each partial range being characterized by a third value and/or fine angular value that can be characterized as a whole number, the position value being measured at a first point in time, and the corresponding first, second and third value being transferred, the third value being transferred with the second value, and/or before or after the second value.

15. A method for controlling a drive, comprising:
    measuring a position value in a periodically repeated process;
    transmitting corresponding information corresponding to the measured position value to a control device;
    characterizing the position value by at least two values, including a partial angular value and a fine angular value, and/or digital values, a first value characterized by a whole number, and a position value range being assigned to each number, wherein the position value range corresponds to a partial section of a complete period that includes the position value;
    assigning each position range characterized by a first value, mutually separate partial ranges of the position range; each partial range being characterized by a second value that can be characterized as a whole number;
    transferring the second value before the first value;
    following transfer of a newly measured second value, a first value, which corresponds to a newly measured first value, is determined from the newly measured and the previously transferred second value, taking additionally into account a most recently determined velocity, and the control device uses the thus determined position value in order to determine an updated value of a manipulated variable of the control device;
    following transfer of the newly measured second value, the velocity value is updated from the newly measured first value and the newly measured second value; a previously measured first value and a previously measured second value also being taken into account, and
    regulating, with the control device, a motor current to a desired setpoint based on the determined position value, wherein the regulating of the motor current includes adjusting a motor voltage.

16. The method according to claim 15, wherein, the first value, following transfer thereof, is compared to a determined value and, in the case of a deviation, an action is triggered, including displaying and/or communicating warning information and/or switching off the drive and/or triggering a safe condition of the drive.

* * * * *